United States Patent [19]

Tom et al.

[11] Patent Number: 4,829,244

[45] Date of Patent: May 9, 1989

[54] BUS AND TAG CABLE MONITORING TAP

[75] Inventors: Gary E. Tom, Bethel; William K. Breech, West Redding; C. Peter Armstrong, Easton, all of Conn.

[73] Assignee: Data Switch Corporation, Shelton, Conn.

[21] Appl. No.: 752,084

[22] Filed: Jul. 5, 1985

[51] Int. Cl.[4] .............................................. G01R 1/04

[52] U.S. Cl. .............................. 324/158 F; 324/73 R; 370/13; 370/85

[58] Field of Search ............ 324/158 F, 73 R, 73 PC, 324/126, 58 R, 95; 370/13, 14, 17, 124, 85; 379/1, 21, 22; 375/10, 36; 333/100, 123, 125; 455/67; 340/825.52, 825.06

[56] References Cited

U.S. PATENT DOCUMENTS

| | | | |
|---|---|---|---|
| 3,336,582 | 8/1967 | Beausoleil et al. | 340/172.5 |
| 3,411,143 | 11/1968 | Beausoleil et al. | 340/172.5 |
| 3,582,906 | 6/1971 | Beausoleil et al. | 340/172.5 |
| 3,743,925 | 7/1973 | Bossi | 324/158 F X |
| 4,086,534 | 4/1978 | Olson | 375/36 X |
| 4,203,066 | 5/1980 | Buck | 324/133 X |
| 4,207,431 | 6/1980 | McVoy | 324/58 R X |
| 4,227,178 | 10/1980 | Gergaud et al. | 340/825.52 |
| 4,393,494 | 7/1983 | Belforte et al. | 370/27 |
| 4,475,191 | 10/1984 | James et al. | 375/36 X |
| 4,498,716 | 2/1985 | Ward | 324/158 F X |
| 4,550,402 | 10/1985 | Gable et al. | 370/67 X |
| 4,556,881 | 12/1985 | Basile | 375/36 X |
| 4,595,923 | 6/1986 | McFarland, Jr. | 333/130 X |
| 4,644,348 | 2/1987 | Gerety | 340/825.06 |
| 4,649,548 | 3/1987 | Crane | 375/7 |
| 4,682,168 | 7/1987 | Chang et al. | 340/825.08 X |
| 4,683,564 | 7/1987 | Young et al. | 370/63 |

FOREIGN PATENT DOCUMENTS

| | | | |
|---|---|---|---|
| 103851 | 6/1985 | Japan | 340/825.06 |
| 189351 | 9/1985 | Japan | 340/825.06 |

OTHER PUBLICATIONS

Proc. of the IEEE, Clark, D. et al., "An Introduction of Local Area Networks", vol. 66, No. 11, Nov. 1978, pp. 1497–1517.

Misco Computer Supplies and Accessories Catalog, Fall/Winter 1984, pp. 84, 85.

*Primary Examiner*—Jerry Smith
*Assistant Examiner*—Stephen M. Baker
*Attorney, Agent, or Firm*—St. Onge Steward Johnston & Reens

[57] ABSTRACT

A monitoring tap for accessing signals on bus or tag coaxial cables used to convey signals between a CPU an external devices is described. A circuit board carrying termination resistors for the coaxial cables and high input isolation amplifiers is provided with an input connector that mates with the plug located in the slot that normally receives a terminator. The circuit board has an output connector coupled to the outputs of the isolation networks. A housing partially encloses the circuit board while enabling external access to the output connector. Several embodiments are described.

9 Claims, 4 Drawing Sheets

BUS AND TAG CABLE MONITORING TAP

FIELD OF THE INVENTION

This invention generally relates to a device for enabling the monitoring of communications between a CPU and external devices. More specifically this invention relates to a device that enables one to monitor the signals at the ends of bus and tag coaxial cables between a CPU and external devices without causing interference attributable to the monitoring.

BACKGROUND OF THE INVENTION

Techniques for accessing signals generated in circuits through test point taps are well known in the art. Such techniques may involve the collection of such test points at a connector for coupling to a remote location where they may be electrically contacted for analysis. Such contact normally does not cause electrical problems, although inadvertent short circuits may be introduced when an oscilloscope probe is applied to a test point. For a large scale computer installation in which signals are transmitted at high speed and the interference with any one signal during operation can cause havoc, access to lines and signals is very carefully controlled to avoid interference. As a result, direct access to signals on electrical coaxial cables between a CPU and a peripheral device is not available in an IBM computer environment.

In a large computer installation a large central processor unit (CPU) may be connected to external devices through a large number of coaxial cables. For example, in a large IBM main-frame computer installation a CPU having as many as 16 channels may have each of these coupled to a peripheral device such as a disk, printer, magnetic tape system or the like. With each channel there are two sets of coaxial cables to enable bidirectional data flow and are known as bus and tag cables. Each bus and tag set of cables may involve some twenty-one cables, though a higher number may be used. In many cases a number of such channels are coupled to a matrix switch where the channels may be connected to any one of a number of peripheral devices Since, in a large CPU installation the signals on the cables are not normally accessible, access to these signals may be needed for trouble shooting or for evaluation and analysis.

In a typical IBM CPU main frame installation a number of peripheral devices are connected to CPU channels through bus and tag coaxial cables that are assembled in connectors and are connected into plugs at the peripheral devices as well as at the CPU channels. These cables are terminated at their ends with pluggable terminators that fit into plugs adjacent to and connected to plugs into which the bus and tag connectors are coupled. The terminators include a plurality of impedance matching elements that are respectively connected through the terminator and bus and tag plugs to respective coaxial bus and tag cables so as to terminate these with a minimum of electrical reflections. Typically, matching impedance elements in the form of resistors equal to the characteristic impedance of the coaxial cables are employed.

The terminators are fully enclosed devices, using passive circuits, and in an IBM main frame system do not enable direct access to the signals on the bus and tag cables. As a result technical problems, as these may arise and are believed related to the cabling system, are not easily resolved; particularly because the signal flow between an IBM CPU channel and an external device involves highly complex signals on many bus and tag lines. Hence, access to all bus and tag cables, about 42 lines, between a channel and an external device is likely to be needed for a complete signal analysis and an identification of a source of errors.

One technique for monitoring a channel of a data transmission circuit is described in U.S. Pat. No. 4,203,066 to Buck. This shows a monitor plug with a plurality of LED lamps and pin-jack access points within a plug for direct monitoring of signals in a patch module. The monitor module employs, as shown in FIGS. 9–12, a connector that plugs into an access opening, a printed circuit board and test jacks adjacent to LED's . The Buck device, however, is not suitable for providing direct access to the signals on bus and tag cables in an IBM mainframe system.

U.S. Pat. No. 3,659,273 to Knauft et al describes a device for checking the operation of peripheral devices. This device enables testing the operation by the addition of circuits that are active during particular times. U.S. Pat. No. 4,037,186 to Palmer et al describes a plug-in module or board to patch or switch electrical signals.

Neither Knauft nor Palmer describe a device that is suitable for providing a direct access to the signals at the ends of bus and tag coaxial cables at various places in an IBM main frame system.

Channel to peripheral matrix switches have been employed in an IBM computer mainframe system to enable a user to connect a channel to any one of a number of peripheral devices. Since access to the signals on the bus and tag coaxial cables is possible within the switch, bus or tag signal monitoring devices have been described for indicating, for example, channel activity. In such matrix switch the signals on the bus and tag cables are applied through so called receivers to the switching mechanism and outputted from the matrix switch through appropriate driver networks. The monitoring devices sample the signals on bus and tag lines as these are available between receivers and drivers. The monitoring devices include high input impedance isolation amplifiers whose inputs are connected to the bus and tag lines between the receivers and drivers.

SUMMARY OF THE INVENTION

With a cable signal monitoring tap in accordance with the invention direct access to signals on the bus and tag co-axial cables of an IBM computer installation is made possible without interference with the signals and without having to break the integrity of these cables.

This is achieved in accordance with one form of the invention with an integral monitoring tap that is shaped to fit within a slot in which a terminator fits and which is mountable to a terminator plug. The tap includes an input connector that couples into the terminator plug whose pins are connected to an adjacently located connector for bus or tag cables. The tap includes a circuit board carrying impedance matching elements that are coupled at junctions to the input connector pins. The junctions are further respectively coupled to inputs of high input impedance isolation networks that are also mounted on the circuit board. Outputs of the isolation networks are coupled to an output connector affixed to the board for access by a suitable analysis apparatus. A housing encloses the circuit board while enabling access to the output connector.

With a monitoring tap in accordance with the invention the high frequency signals on the bus or tag coaxial cables can be directly accessed before they pass through other components of a peripheral device or CPU. Such access can be achieved without interference with the bus or tag signals even when probes or other analyzing devices are brought into contact with the outputs of the isolation networks.

The isolation networks preferably include active amplifiers which are energized through pins of the output connector. The amplifiers have a high input impedances and prevent electrical disturbances as these may occur on their outputs from affecting the amplifier inputs. As a result the attachment of an elongate service cable to the output connector of a monitoring tap does not affect communications on the bus or tag lines, yet enables their monitoring without interference.

With a device in accordance with the invention all of the various bus and tag lines in a computer installation can be monitored by replacing each of the terminators with a device of this invention. In the event of a problem, trouble shooting can be conveniently carried out at many places while the system is operating.

It is, therefore, an object of the invention to provide a convenient monitoring tap for directly accessing signals on cables of a computer installation without causing any interference with the signals. It is a further object of the invention to provide a monitoring tap to access the signals on bus or tag coaxial cables of an IBM computer main frame installation in a convenient manner without endangering the integrity of the operation of the computer installation.

These and other advantages and objects of the invention can be understood from a detailed decription of the invention as hereinafter described in conjunction with the drawings.

DETAILED DESCRIPTION OF DRAWINGS

Figure 1:
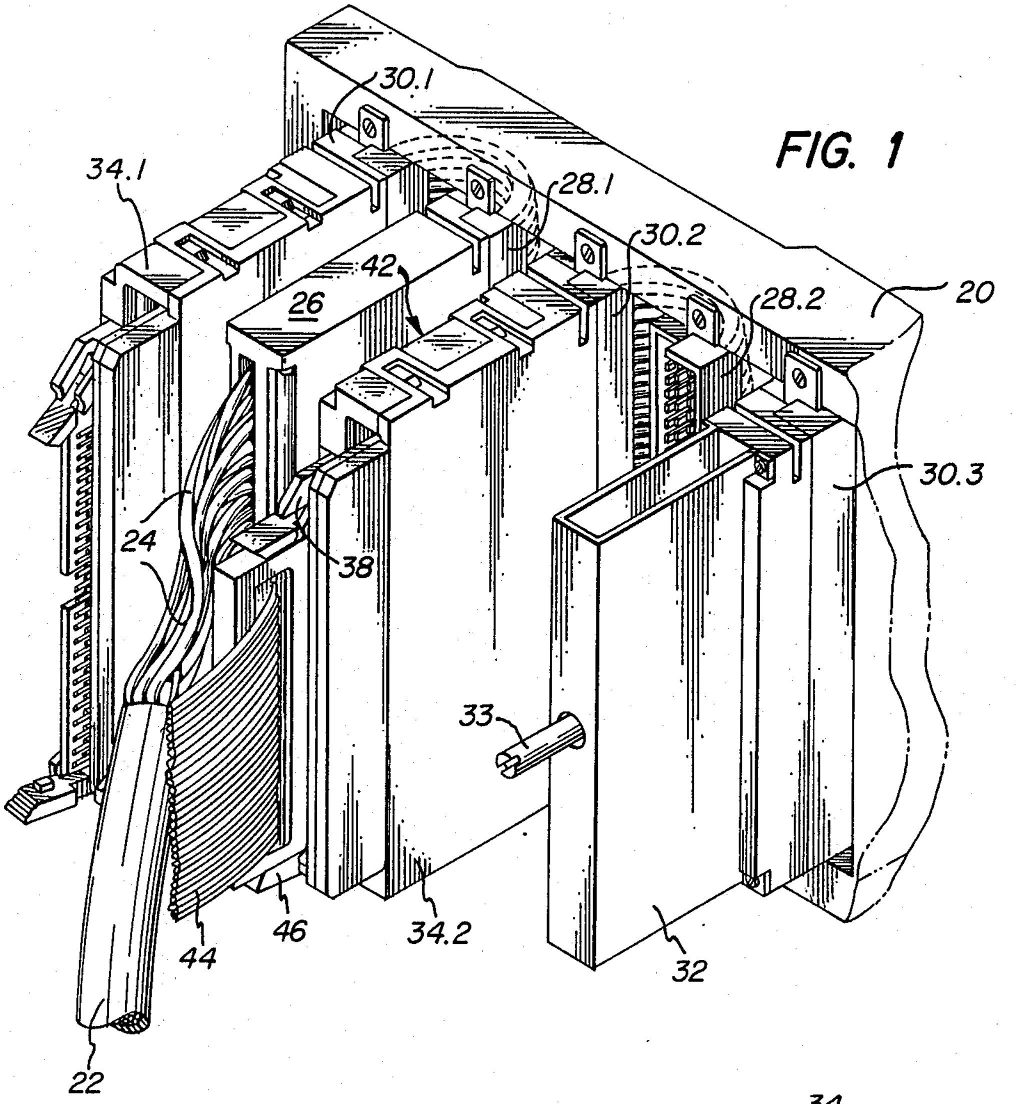
FIG. 1 is a partial perspective view of a connector frame to which a monitoring tap in accordance with the invention, a terminator and a bus or tag coaxial cable connector are connected.

With reference to FIG. 1 a part of a connector frame 20 is shown for an external device (not shown) connected to an IBM main frame computer (not shown). Such frame 20 may be typical of what is used to support and connect bus and tag coaxial cables such as 22 between an IBM main frame computer and external devices such as peripheral tape or disk storage units, printers, matrix switches and the like.

In FIG. 1 a bus or tag set 22 of coaxial cables 24 is shown wired to an end connector 26 which in turn connects into a frame plug 28.1. The latter has its pins coupled to various devices inside the equipment (not shown) in which the frame 20 is located as well as to an adjoining plug 30.1.

Each plug 30.1–30.3 normally receives a terminator 32 which includes a plurality of impedance matching elements selected to terminate each of the coaxial cables 24 with its characteristic impedance. As can be seen in the view of FIG. 1 there are no ways to directly access the signals on a bus or tag coaxial cable before it passes into the equipment. Even the terminator 32 fully encloses its circuitry, thus rendering access to the signals therein impractical. Screw 33 is used to firmly affix terminator 32 to a plug 30. Even if the signals inside the terminator were made accessible at test points, however, a probe, when applied to a line or a test point, is likely to interfere with the signal.

Figure 7:
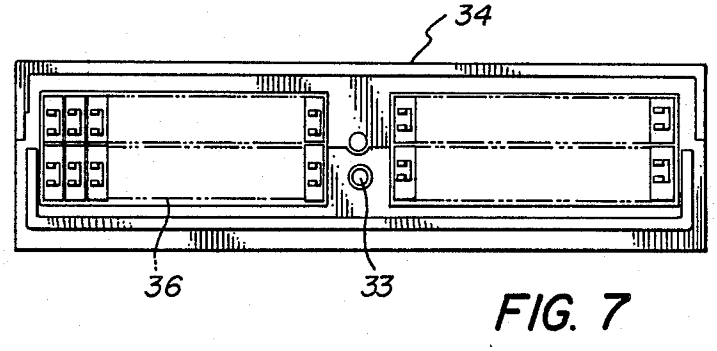
FIG. 7 is a front view of the input of the tap shown in FIG. 3.

Hence, in accordance with the invention, in place of terminators 32, taps 34 are connected to plugs 30. Each tap 34 has an input connector 36, see FIG. 7, which fits into a plug 30 and has an output connector 38, see FIG. 1, on which the signals on bus and tag coaxial cables 24 are made available without distortion and without harm to the bus and tag signals. Tap 34 has a housing 40 sized to fit within the slot 42 allocated for terminators such as 32, i.e. between bus or tag coaxial connectors 26. A cable 44 and analyzer connector 46 couple to output connector 38 to enable analysis of the bus or tag signals made available by tap 34.

Figure 2:
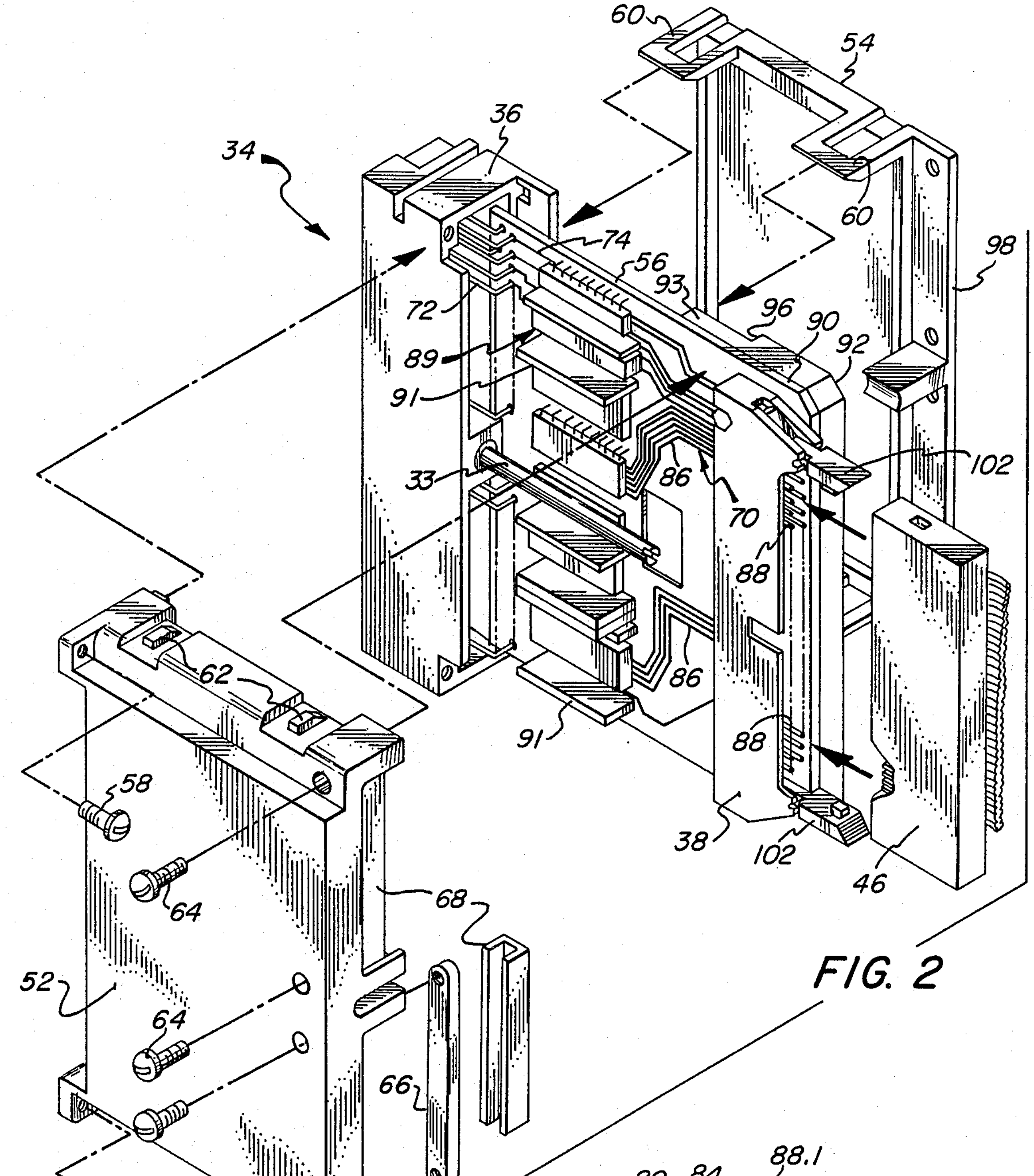
FIG. 2 is a perspective exploded view of a tap in accordance with the invention.
Figure 2A:
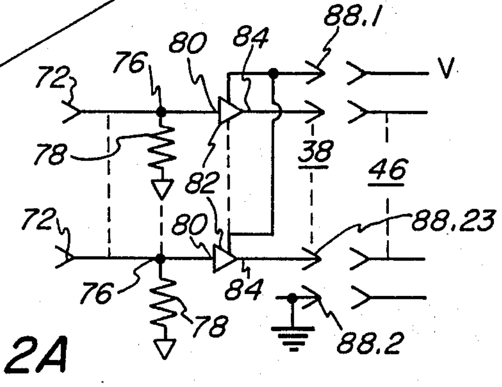
FIG. 2A is a partial schematic diagram for a tap in accordance with the invention.
Figure 3:
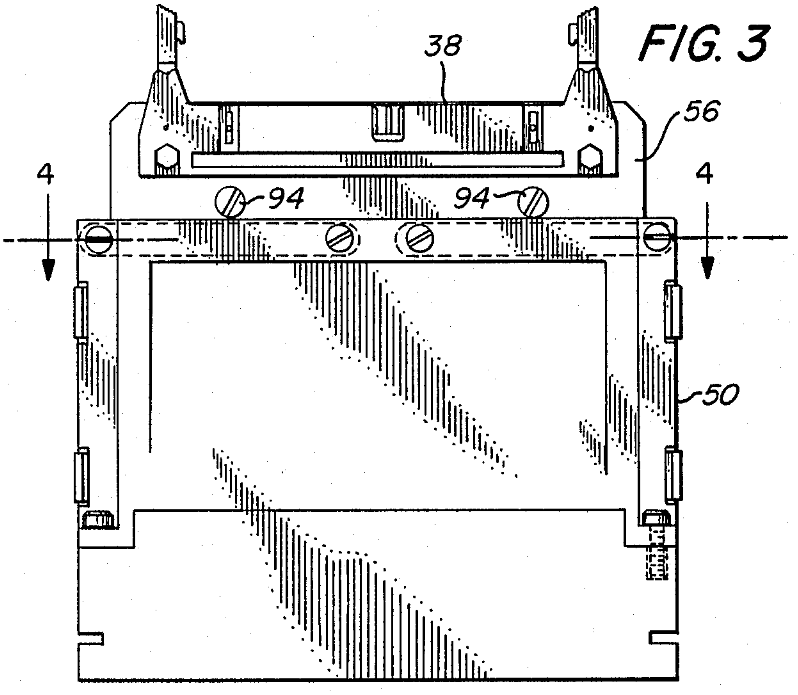
FIG. 3 is a side view in elevation of the assembled tap shown in FIG. 2.
Figure 5:
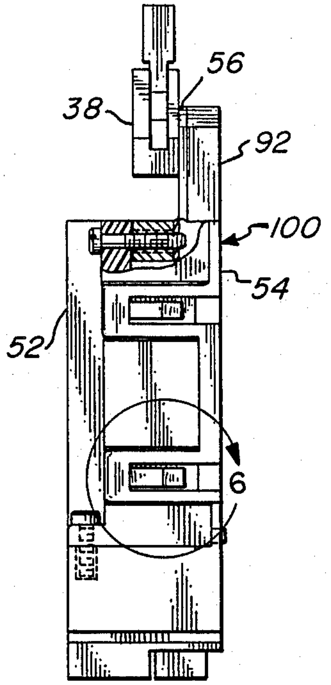
FIG. 5 is a side view of the tap of FIG. 3.
Figure 4:
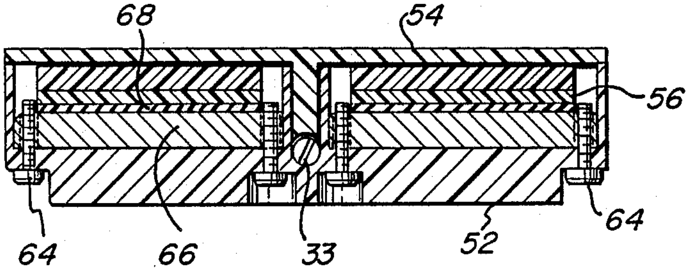
FIG. 4 is a section view of the tap taken along the line 4—4 in FIG. 3.
Figure 6:
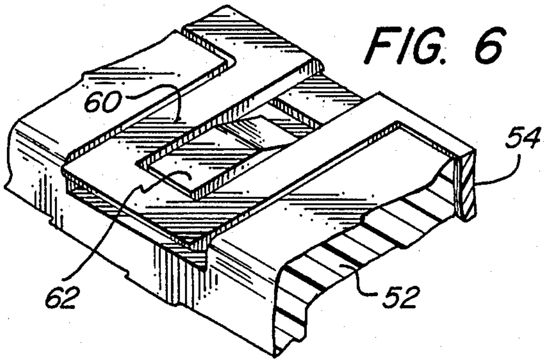
FIG. 6 is an enlarged partial view of a clamp used on the housing for the tap of FIG. 5.

The monitoring tap 34 of this invention includes as illustrated in FIGS. 2–6 an input connector 36 that is similar to the connector assembly used on conventional terminators such as 32. The tap 34 is formed with a separable housing 50 formed of side panels 52, 54 that affix to and substantially enclose a printed circuit board 56 and the input connector 36. Housing 50 may be similar to the type used to enclose and support a bus or tag set of coaxial cables as illustrated in FIG. 2. Screws such as 58 affix panel 52 to input connector 36. Panel 54 releasably affixes to panel 52 with clamping clips 60 that engage projections 62 on panel 52. Screws 64 affix to clamping spacer bars 66 having resilient insulator rubber cushions 68 to firmly engage areas, such as 70 on printed circuit board 56.

The printed circuit board 56 has, projecting from one end, the input connector 36 whose pins 72 are affixed through suitable holes in board 56 and electrically coupled to conductors with solder in a manner as is well known in the assembly of printed circuit boards. In the particular embodiment there are more pins 72 than there are coaxial cables in a bus or tag set of cables 24 and, therefore, a number of pins 72 are not connected to a conductor such as 74. Each pin 72 is connected, as shown in FIG. **2*a*, to a junction 76. The junction 76 is connected to a terminating resistor 78 and the input 80 of an active isolation network 82 in the form of a high input impedance amplifier. The outputs 84 of amplifiers 82 are respectively coupled along conductors 86 to pins 88 of output connector 38 that is affixed to end segment 90 of board 56 that is opposite to the end of which the input connector 36 is affixed. At least first and second pins such as 88.1 and 88.2 are coupled to supply electrical power to amplifiers 82. The various terminating resistors 78 and isolation amplifiers 82 are preassembled in circuit chips as illustrated at 89 and 91 on circuit board 56**.

Output connector 38 and end segment 90 of board 56 project from the housing panels 52, 54 so as to enable the attachment of coupling connector 46 to output connector 38. An insulative spacer plate 92 is affixed to end 90 of board 56 with suitable screws such as 94, see FIG. 3. Plate 92 reinforces board 56 at segment 90 and assists in providing a clamping and seating surface for side panel 54. Plate 92 has a seating edge 96, see FIG. 2 against which edge 98 of side panel 54 is seated as illustrated at 100 in FIG. 5. Plate 92 overlies conductors and pins on board segment 90 as may be located at the side of the plate. Portion 93 of plate 92 further serves to substantially close a gap between side panels 52, 54 when these are assembled to each other and board 56.

When the monitoring tap 34 is assembled and connected the conductors 74 and circuit elements that are coupled to bus or tag cables 24 are physically not accessible and thus protected, yet electrical monitoring is permitted at the pins 88 of output connector 38. Latching pins 102 are provided to affix a monitoring cable and connector 46 to connector 38.

Figure 8:
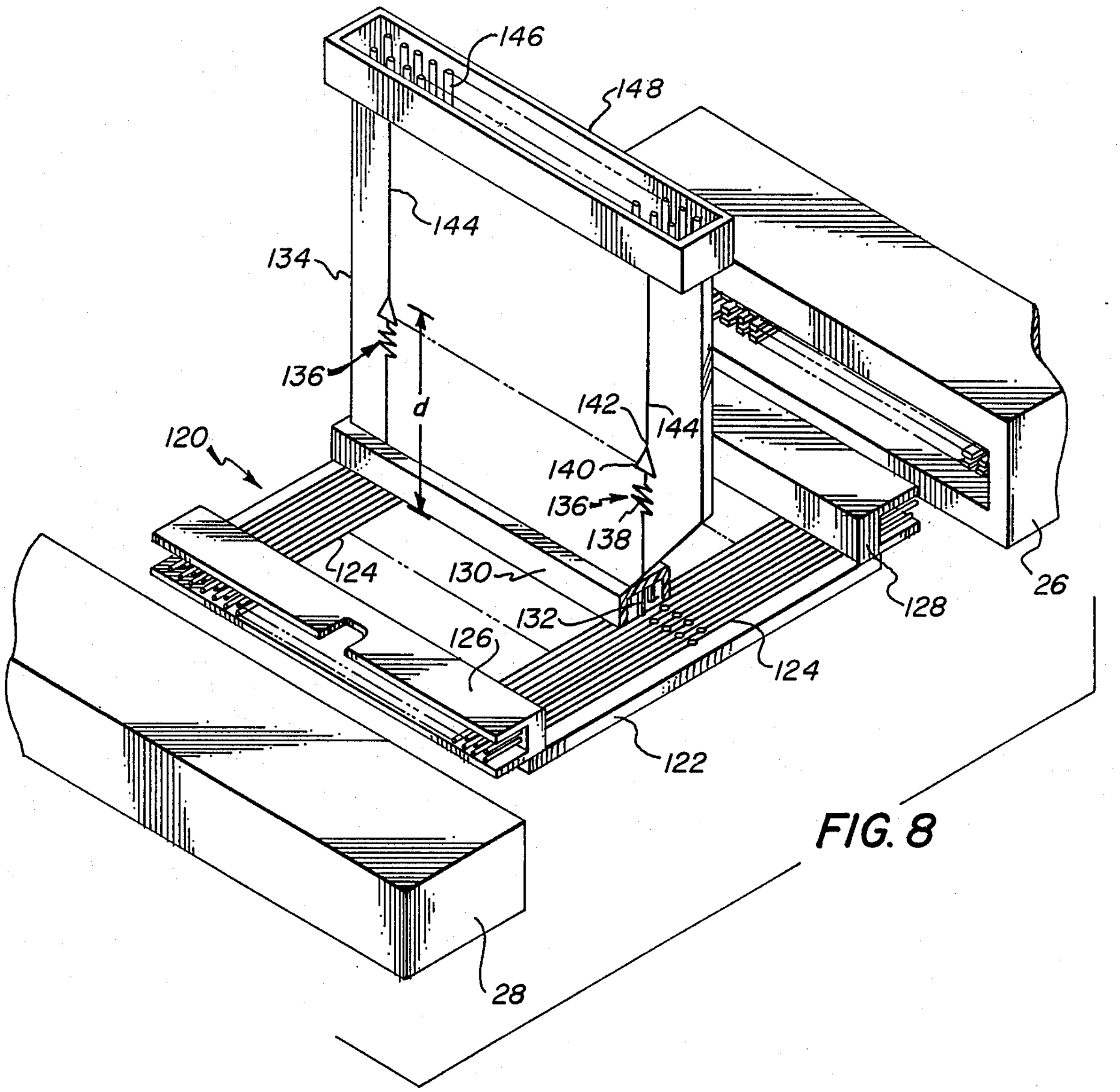
FIG. 8 is a schematic perspective view of a T-shaped monitoring tap in accordance with the invention.

FIG. 8 is a schematic representation of a T-shaped monitor tap 120 for bus or tag sets of coaxial cables. Tap 120 has a circuit board 122 with conductors 124 between end located bus or tag connectors 126, 128. At an intermediate position is a third connector 130 whose pins 132 are respectively connected to conductors 124. Connector 130 is mounted on a circuit board 134 on which isolation networks 136 are placed, one for each conductor 124. Connector 130 engages a suitable connector on board 122. The networks 136 include a series coupled resistor 138 and a high input impedance active isolation amplifier 140. The output 142 of the isolation amplifiers 140 are coupled by conductors 144 to pins 146 of an output connector 148.

The monitor tap 120 is enclosed by a suitable housing, not shown, so that the conductors 124 are not physically accessible. The isolation networks 136 are located in circuit chips in a manner as illustrated in FIG. 2. The distance d between the input of isolation networks 140 and the plane in which the bus or tag conductors 124 lie is preferably as short as possible to avoid the creation of a low impedance or short circuit condition when an effective open circuit termination is approximately a quarter wavelength away from conductors 124.

Having thus described a monitoring tap for bus and tag coaxial cables used to connect a CPU to peripheral equipment, the advantages of the invention can be appreciated. Variations can be made without departing from the scope of the invention as determined by the claims.

What is claimed is:

1. A monitoring tap to enable access without electrical interference to signals present on bus or tag coaxial cables used in the communication between a CPU and external devices where the bus and tag coaxial cables are coupled to bus and tag connectors adjacent to which are slots in which terminator plugs can be located and connected to receive terminators which terminate the coaxial cables with matching impedance elements, comprising:

an integral removable tap assembly shaped to fit within the slot in which a terminator fits, said tap assembly including a housing and having an input connector selected to couple into and mount to a terminator plug, said input connector having a plurality of pins for respective connection through the terminator plug and a bus or tag connector to a bus or tag coaxial cable;

a plurality of impedance matching elements in said housing and effectively coupled to the pins of the first connector of the housing;

a plurality of isolation networks in said housing and effectively having high input impedance inputs coupled to the pins, said isolation networks having outputs; and an externally accessible output connector having pins that are respectively coupled to the outputs of the isolation networks, whereby operational access to signals on said bus or tag coaxial cables can be obtained through the output connector while providing an impedance match termination for said cables.

2. The monitoring tap as claimed in claim 1 and further including a printed circuit board on which the input connector, the impedance matching elements, isolation networks and the output connector are mounted, said printed circuit board being substantially enclosed by the housing with an exposed segment bearing the output connector.

3. The monitoring tap as claimed in claim 2 wherein the exposed board segment supports the output connector at one side, and an insulator spacer plate mounted on the other opposite side of the exposed segment.

4. The monitoring tap as claimed in claim 3 wherein the plate has a gap filling portion that extends into the housing, and wherein the plate has a seating edge against which an end of the housing is seated.

5. The monitoring tap as claimed in claim 4 wherein said housing is formed of first and second mating panels which, when attached to said board enclose the matching elements and the isolation networks.

6. The monitoring tap as claimed in claim 5 and further including clamping space bars located between a side panel and the circuit board and resilient cushions placed between the bars and the circuit board to enable a firm clamping of the circuit board between the side panels.

7. A monitoring tap to enable access without causing electrical interference of signals present on bus or tag coaxial cables used in the communication between a CPU and external devices where the bus and tag coaxial cables are coupled to bus and tag connectors adjacent to which are slots in which terminator plugs are located and connected to receive removable terminators which terminate the coaxial cables with matching impedance elements, comprising:

a printed circuit board having input circuits for connection to the coaxial cables;

input connector means affixed to the circuit board at one end thereof for removably mounting to and operatively engaging the terminator plug to interconnect the input circuits through the plug to the coaxial cables;

a plurality of active isolation network inputs and outputs, mounted on the circuit board and having inputs respectively coupled to the junctions, for generating on its outputs output signals that are representative of the signals on the bus or tag coaxial cables while being electrically sufficiently isolated therefrom to prevent electrical interference with the signals on the cables in response to electrical changes on the outputs;

an output connector affixed to the circuit board and having pins coupled to the outputs of the active network means; and housing means for partially enclosing the printed circuit board with said input circuits and active isolation network means, whereby operational access to signals on said bus or tag coaxial cables can be obtained through the output connector while providing an impedance match termination for said cables.

8. The monitoring tap as claimed in claim 7 wherein said output connector includes at least first and second pins coupled to all of the active isolation network means to provide electrical power thereto.

9. The monitoring tap as claimed in claim 8 wherein the isolation networks are formed with high input resistance amplifiers whose outputs are connected to pins of the output connector.

* * * * *